(12) United States Patent
Chen et al.

(10) Patent No.: US 7,791,181 B2
(45) Date of Patent: Sep. 7, 2010

(54) DEVICE STRUCTURE WITH PREFORMED RING AND METHOD THEREFOR

(75) Inventors: Lung-Tai Chen, Fongshan (TW); Chun-Hsun Chu, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/014,636

(22) Filed: Jan. 15, 2008

(65) Prior Publication Data

US 2009/0020862 A1 Jan. 22, 2009

(30) Foreign Application Priority Data

May 30, 2007 (TW) ................ 96119341 A

(51) Int. Cl.
*H01L 23/495* (2006.01)
(52) U.S. Cl. ............. 257/676; 257/414; 257/444; 257/484; 257/688; 257/E23.031; 257/E21.001
(58) Field of Classification Search ........... 257/127, 257/170, 181, 414, 423–440, 484, 605, 688, 257/427, 444, 666–676, E23.031, E21.001, 257/678
See application file for complete search history.

(56) References Cited

U.S. PATENT DOCUMENTS

| | | |
|---|---|---|
| 4,563,697 A | 1/1986 | Miura |
| 4,655,083 A | 4/1987 | Chubachi |
| 4,823,605 A | 4/1989 | Stein |
| 5,209,120 A | 5/1993 | Araki |
| 5,465,626 A | 11/1995 | Brown et al. |
| 5,852,320 A | 12/1998 | Ichihashi |
| 5,897,338 A | 4/1999 | Kaldenberg |
| 6,066,882 A | 5/2000 | Kato |
| 6,379,988 B1 | 4/2002 | Peterson et al. |
| 6,401,545 B1 | 6/2002 | Monk et al. |
| 6,441,503 B1 * | 8/2002 | Webster ............. 257/787 |
| 6,927,482 B1 | 8/2005 | Kim et al. |
| 6,930,398 B1 | 8/2005 | Sun et al. |
| 7,327,005 B2 * | 2/2008 | Brechignac et al. ...... 257/434 |
| 2004/0188782 A1 * | 9/2004 | Fujii .................. 257/415 |
| 2005/0186703 A1 * | 8/2005 | Weiblen et al. ........ 438/106 |
| 2008/0054444 A1 * | 3/2008 | Tuttle ................ 257/698 |

FOREIGN PATENT DOCUMENTS

CN 1956202 A 5/2007

\* cited by examiner

*Primary Examiner*—Jasmine J Clark
(74) *Attorney, Agent, or Firm*—Workman Nydegger

(57) ABSTRACT

A device structure with preformed ring includes a sensor chip and a ring disposed and surrounded on periphery of sensitive area of an active surface thereof. The device structure with preformed ring may batchly bind and electrically connect to a carrier by a way of two-dimension array, and then a packaging process is performed. During the packaging process, the top portion of the ring can be used to against the inner side of a packaging mold, so as to stop the packaging material covering the device at outside of the ring and stick with the ring. Therefore, an opening is formed on the sensitive area surface of the device. Depending on the ring, the extra process for eliminating the packaging material on the sensitive area surface can be avoided in the conventional process.

8 Claims, 11 Drawing Sheets

DEVICE STRUCTURE WITH PREFORMED RING AND METHOD THEREFOR

CROSS-REFERENCE TO RELATED APPLICATIONS

This non-provisional application claims priority under 35 U.S.C. §119(a) on Patent Application No(s). 096119341 filed in Taiwan, R.O.C. on May 30, 2007, the entire contents of which are hereby incorporated by reference.

BACKGROUND

1. Field of the Invention

The invention relates to a device structure and the process thereof and more particularly to a device structure and the process thereof which forms a ring on the sensitive area of the sensor chip in order to bind to the sealant, and forms an opening in the ring.

2. Related Art

Lately, certain consumer electronic goods such as a watch manometer or a cell phone can be very successful by integrating a manometer therein. Therefore, based on the increase demand of the forgoing applications, how to provide a low cost manometer module and a small size of manometer module becomes a concern in this manometer module assembly business, since the pressure sensor is where the main cost of the assembly will be. According to the present technology, the design of a pressure sensor assembly is primarily following a two step process, where a preformed lead pin frame process is followed by an exterior cover process. The differences between those related patents involve the structure of the preformed lead frame, the location of the test pressure source conducting hole or the location of the reference atmosphere pressure hole. The prior patents, such as U.S. Pat. Nos. 5,852,320, 4,655,083, 5,465,626, 6,066,882, 4,563,697 and 5,209,120 are mainly focus on the use of a single unit process to perform the assembly of the relative pressure sensitive module. As to the structure of the preformed lead frame, they are mainly using a TO-can plastic frame with an outer lead metal. And regarding to the lead welding structure of the electric interface of the pressure sensitive module, there are two kinds of processes: one is through hole and the other is surface mount technology (SMT).

In addition, more and more pressure sensor modules are introducing a one dimensional batch process, where uses a bulk substrate with a matured one body mold to increase the throughput of the pressure module. The bulk substrate often is a printed electric board (PCB) or a lead-frame. Basically, the molding process in nature has an inherent property of mass production which has an advantage in cost reduction, so it is widely accepted by the major assembly manufacturers that it is an efficient process for cost down. However, in order to fulfill the special need when design a chip sensor of a pressure sensitive module, the sensor chip, the test pressure source conducting hole and the reference atmosphere pressure hole must to be processed or to be released before or after the molding process. There are three kinds of processes to do it. The first one is occupying the location of the via with a inserted bump mold in advance before the injection forming process of the molding is performed, and then after the mold is filled with the liquid plastic and becomes solid, the inserted object which is in the mold will be separated along with the mold removing process. So, the via hole will be formed naturally. The process is shown in U.S. Pat. No. 5,897,338.

Another process is so-called process to release method, which is using the etching process after the whole sensor module is molding and formed to etching out the material of the unnecessary part of the area which is designed for the hole till the sensor chip or the protection layer above is exposed. As a result, the via space for the sensor chip is released. The related patents can refer to U.S. Pat. No. 4,823,605 and the U.S. Pat. No. 6,379,988. FIG. 1A shows the micro-electro-mechanical pressure sensitive device 10 of the U.S. Pat. No. 6,379,988. In the figure, in order to protect the micro-sensor or the actuator above the micro-electro-mechanical sensor 11, before the molding process of the micro-electro-mechanical sensor 11, a sacrificed protection layer 13 will be in advance covered on the micro-electro-mechanical sensor 11 and will be embedded in the molding material 14 after the molding process. Consequently, there must be a window to be opened above the micro-sensor or the actuator 12. The window opening process is shown in FIG. 1B and FIG. 1C, where there are two different strong acids used for spray etching. In one process, a first pad 15 is formed on the molding material 14 to define the area to be etched. Then, a first strong acid 16 is sprayed for a certain amount of time to allow the molding material 14 which is exposed to the first strong acid 16 to be able to be removed to expose the sacrificed protection layer 13. After that, a second pad 17 is used to cover the first opening area of the molding material, and a second strong acid 18 is used for spray etching for a certain amount of time to remove the sacrificed protection layer 13. So the micro-sensor or the actuator 12 of the micro-electro-mechanical sensor device 11 will be released and exposed to the air.

The other process is a mix, which utilizes the two-step preformed lead frame process and the one-dimensional batch process. The exterior cover process is used to form the sensitive via hole of the sensor chip while the whole sensor module is formed by one body molding. That is, the sensor chip after formed by the one body molding process is binding to the saved space of the formed module and the exterior cover which has a saved via hole will then assemble to the sensor module body. The related patents are U.S. Pat. Nos. 6,927,482 and 6,401,545.

To summarize the forgoing processes, the single unit process method may have the throughput problem, which on the other hand may make a high cost preformed lead plastic substrate device even more costly. Therefore, from a view of upstream and downstream manufacturers, it is very difficult to reduce the overall cost of the assembly. Thus, a new package model is probably a possible and necessary way to solve this problem. In addition, the through hole and the metal lead frame processes need more foot print area than the regular base area of the manometer module, which will put a limitation to the reduction of the size of the whole module.

SUMMARY

The present invention is to provide a device structure with preformed ring and the process thereof, so an opening can be naturally formed above the sensitive area while the sensor chip is packaging.

The device structure of the present invention with preformed ring includes: a sensor chip and a ring. The sensor chip has an active area and a back. The active area has a sensitive area and a plurality of pads. The ring is disposed on the active area of the sensor chip and surrounding the periphery of the sensitive area.

The back in the foregoing embodiment further includes a cave and can be covered by a supporting structure layer which has a hole.

The foregoing embodiment can apply to a sensor chip packaging and can further include binding and electric coupling the foregoing device structure to a carrier, where when sealing, the top of the ring will be against the top inner face of the mold to make the sealant only surround and combine outside the ring, so the interior of the ring can naturally form a space for the sensitive area of the sensor chip.

The ring of the foregoing embodiment can be formed by a thick film process, such as a stencil printing, a spin-coating, a plastic film hot pressing and so on.

The invention may have the following effect. The device structure can be batch formed by using a wafer, and when applied to the sensor chip packaging, a two dimensional batch processing can be applied in order to bind the sensor chip to the carrier and then sealed at once. So as a result, the process can be simplified and the device structure needs not to be removed after sealing, and the hollow area inside of the ring will be the future via hole for the sensor chip.

BRIEF DESCRIPTION OF THE DRAWINGS

The present invention will become more fully understood from the detailed description given below, which is for illustration only and thus is not limitative of the present invention, wherein.

DETAILED DESCRIPTION

Figure 1A:
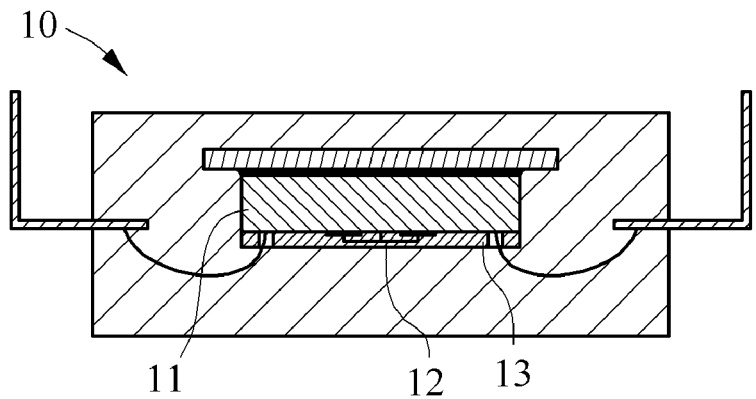
FIG. 1A, FIG. 1B and FIG. 1C show a diagram flowchart of a prior manufacturing method of an opening of the sensitive area of the micro-electro-mechanical sensor device.
Figure 1B:
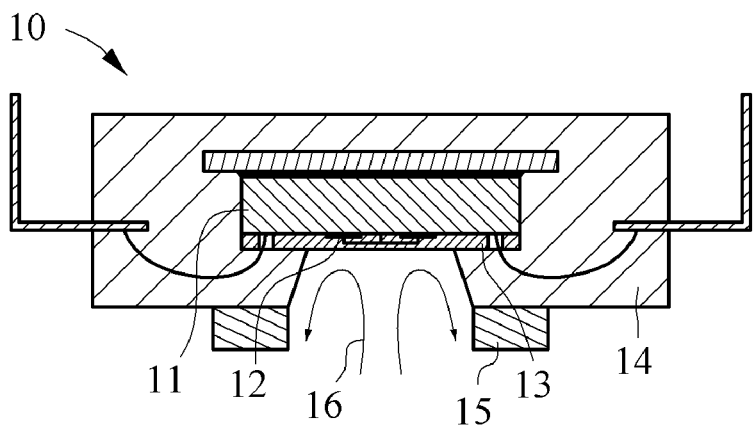
Figure 1C:
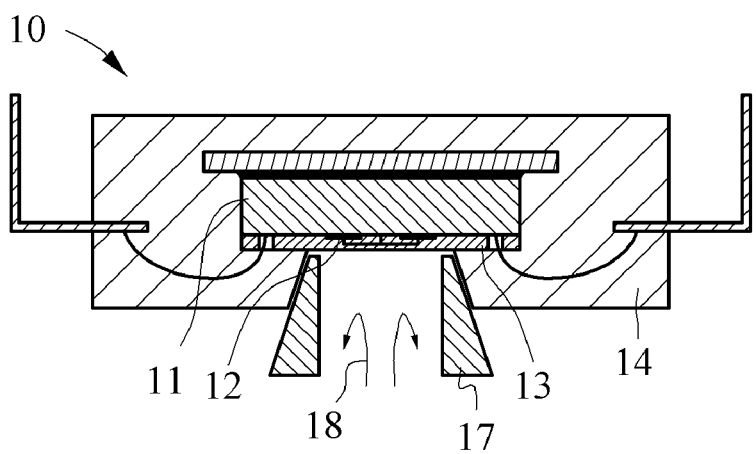
Figure 2A:
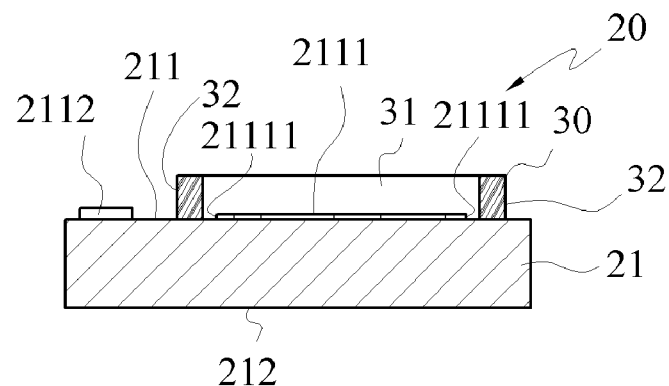
FIG. 2A is a diagram showing a cross section view of the sensor chip according to the invention.
Figure 2B:
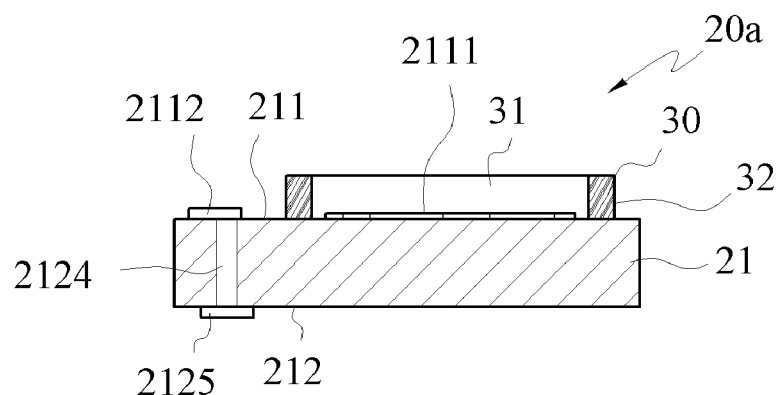
FIG. 2B is a diagram showing a cross section view of an illustrative embodiment of via hole of the device structure according to the invention.
Figure 2C:
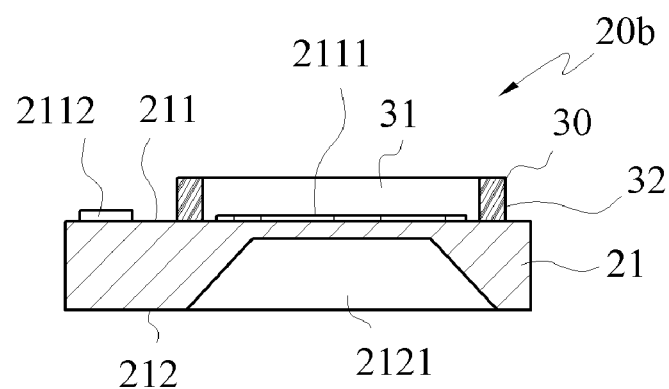
FIG. 2C is a diagram showing a cross section view of an illustrative embodiment of the device structure where the back has a cave according to the invention.
Figure 2D:
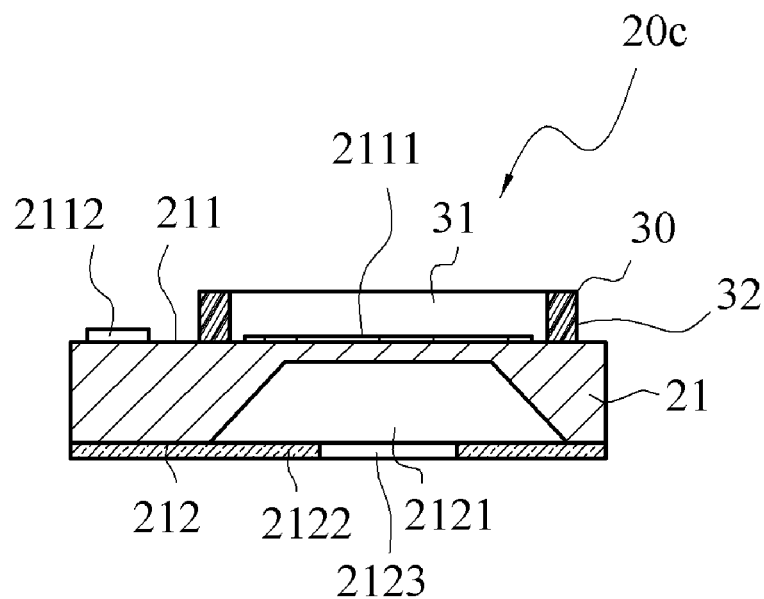
FIG. 2D is a diagram showing a cross section view of an illustrative embodiment of the device structure where the back has a cave and a supporting plate with a hole according to the invention.
Figure 2E:
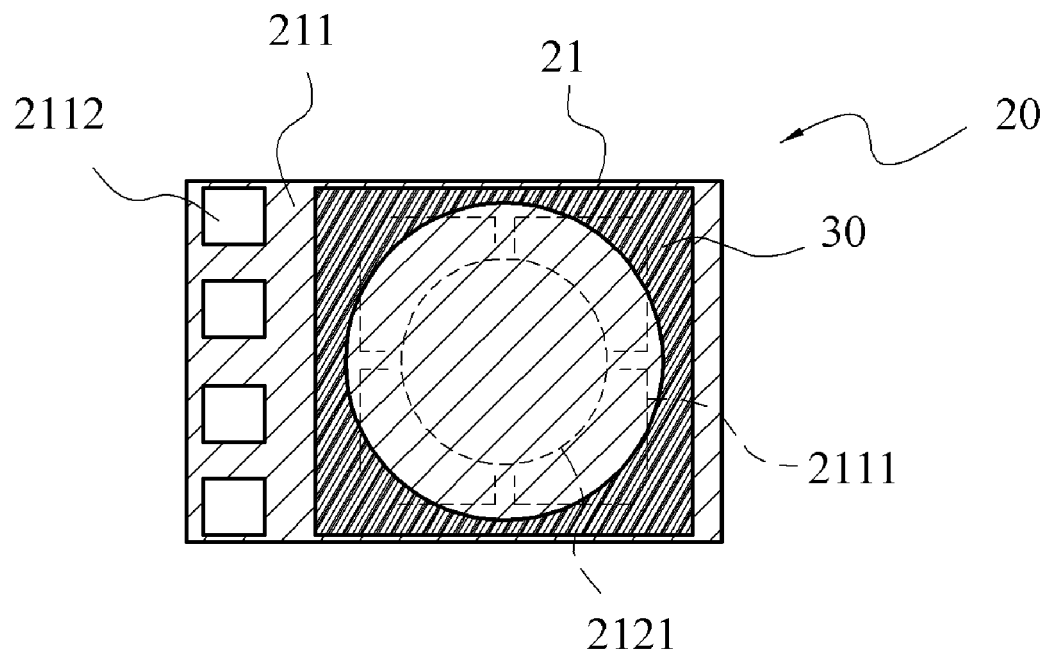
FIG. 2E shows a vertical view of the FIG. 2D.

FIG. 2A and FIG. 2D show the device structure with preformed ring according to the invention, which includes a sensor chip 21 and a ring 30. The sensor chip 21 has an active surface 211 and a back 212. The active surface 211 has a sensitive area 2111 and a plurality of pads 2112. The ring 30 is disposed on the active surface 211 of the sensor chip 21 and surrounding the periphery 21111 of the sensitive area 2111 and has a hollow interior area 32.

FIG. 2B is a cross section view of an embodiment of the via hole of the device structure according to the invention. The bottom of the pad 2112 of the device structure 20a can further include an electric conductive hole 2124 which penetrates through to the back 212. On the back 212 where corresponds to the electric conductive hole 2124 is disposed a bottom pad 2125, which connects to the electric conductive hole 2125 through a metal wire.

In FIG. 2C and FIG. 2D, the foregoing embodiment can also have a cave 2121 on the back 212 of the sensor chip 21 to form the device structure 20c. Because forming a cave 2121 on the back will reduce the chip's rigidity, a supporting structure layer 2122 can be further formed on the back 212, which will constitute the device structure 20d. The supporting structure layer 2122 includes a hole 2123 which corresponds to the cave 2121. The structure layer 2122 also can cover the back 212 in order to increase the rigidity of the structure.

Figure 3A:
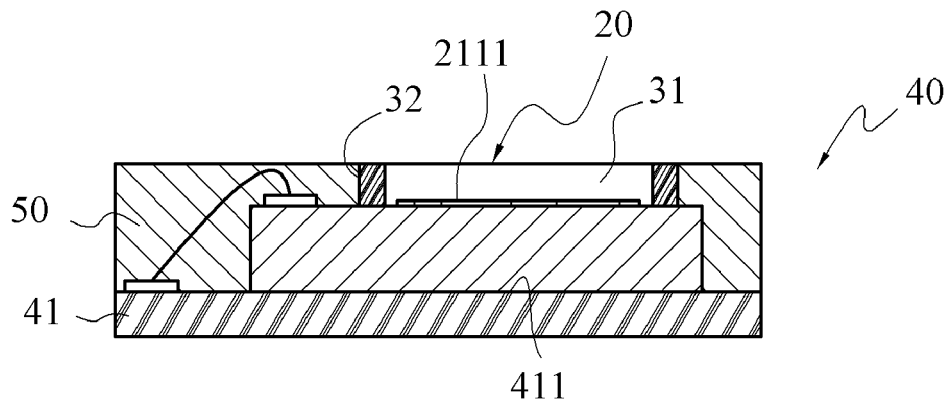
FIG. 3A is a diagram showing a cross section view of the sensor chip package according to the invention.

In FIG. 3A, the embodiment of the sensor chip package 40 according to the invention is binding and electric coupling the foregoing device structure 20 to an upper surface 411 of a carrier 41 and forming an encapsulation 50 which covers the device structure 20 and the upper surface 411 of the carrier 41.

Figure 3B:
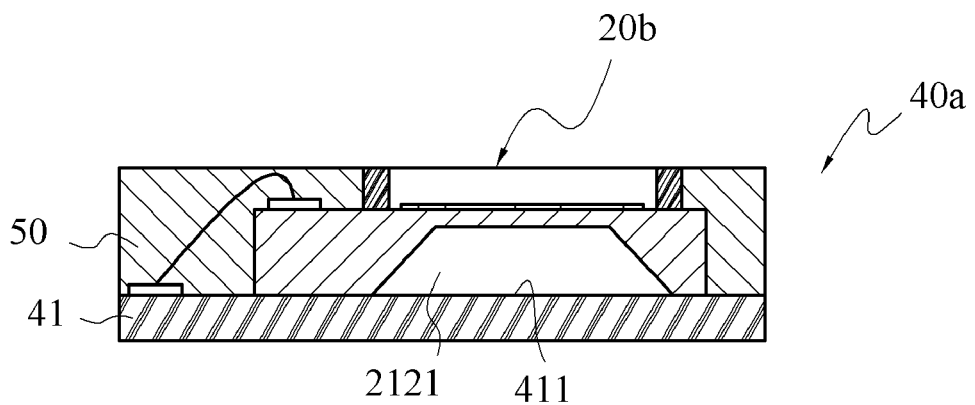
FIG. 3B is a diagram showing a cross section view of an illustrative embodiment of the sensor chip package where the back of the sensor chip has a cave according to the invention.

FIG. 3B shows the embodiment of the sensor chip package 40a where the device structure 20a is binding and electric coupling to an upper surface 411 of a carrier 41.

Figure 3C:
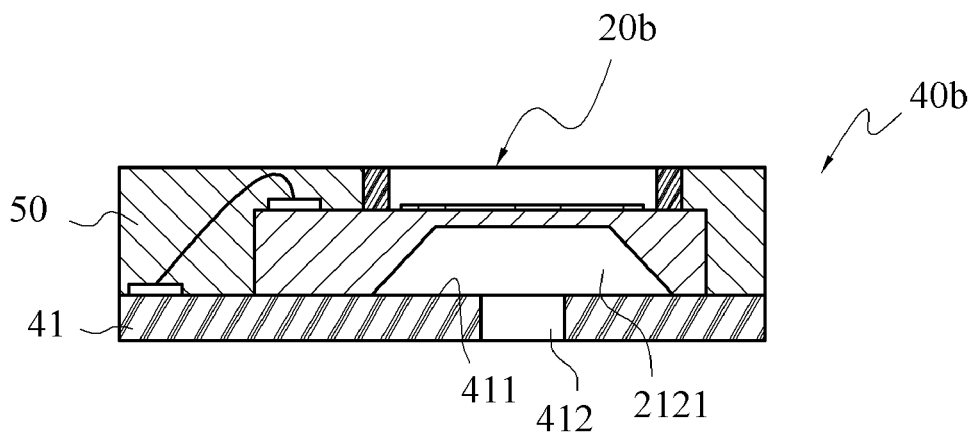
FIG. 3C is a diagram showing a cross section view of an illustrative embodiment of the sensor chip package where the back of the sensor chip has a cave and the carrier has a via hole according to the invention.

FIG. 3C is similar to the embodiment in FIG. 3B, where the carrier 41 can further have a via hole 412 which corresponds to the cave 2121 so that via hole 412 can interconnect with the cave 2121, which constitutes a sensor chip package 40b embodiment.

In the foregoing embodiment of sensor chip package 40b, the device structure 20a also can apply to the device structure 20b which has a supporting structure layer 2122.

The forgoing sensor chip packages 40, 40a and 40b can apply to structures with different function in order to form different kinds of sensor modules.

Figure 4A:
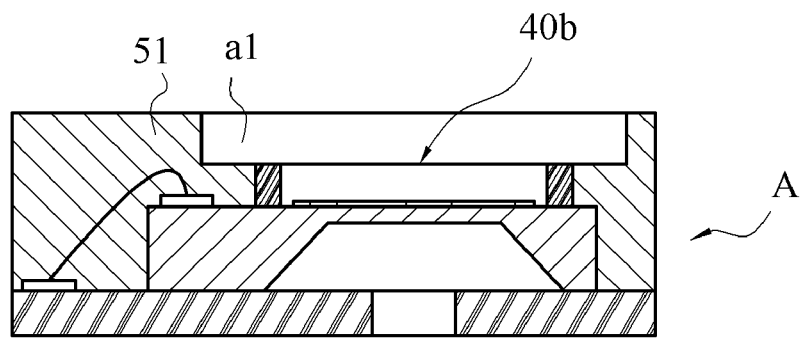
FIGS. 4A to 4C show the cross views of an illustrative embodiment of the invention which applies to the substrate.

In FIG. 4A, the sensor module A embodiment is using the sensor chip package 40b (or the embodiment which has a supporting structure layer 2122), and the top of the packing sealant 51 is above the top of the ring 30 to form a cave a1 space above the top of the ring 30.

Figure 4B:
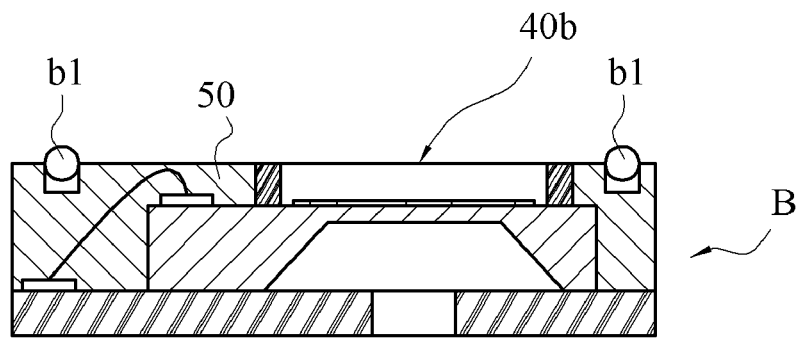

In FIG. 4B, the sensor module B is using the sensor chip package 40b (or the embodiment which has a supporting structure layer 2122), and is embedding an O-ring b1 in the encapsulation 50.

Figure 4C:
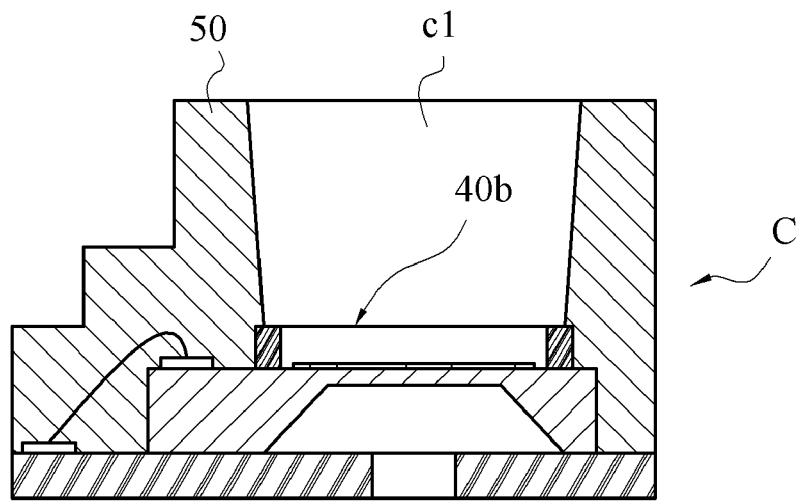

In FIG. 4C, the sensor module C is using the sensor chip package 40b (or the embodiment which has a supporting structure layer 2122) and is forming a guide tube c1 on the encapsulation 50 to form an external connecting guide. In the foregoing sensor module A, B and C, the carrier 41 can be one with the via hole 412 or an solid object without the via hole 412. Certainly, when the carrier doesn't have the via hole 412, the device structure 40b need not to have the supporting structure layer 2122.

Figure 5A:
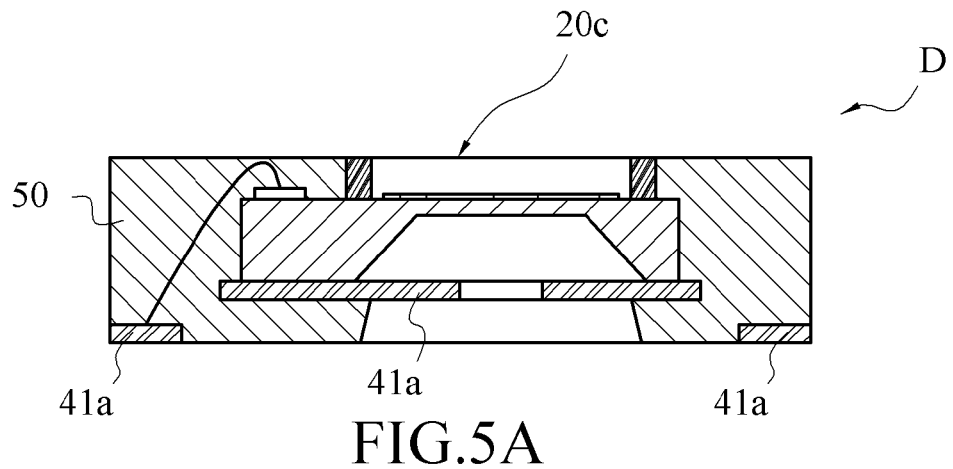
FIGS. 5A to 5C show the cross views of an illustrative embodiment of the invention which applies to the lead frame.
Figure 5B:
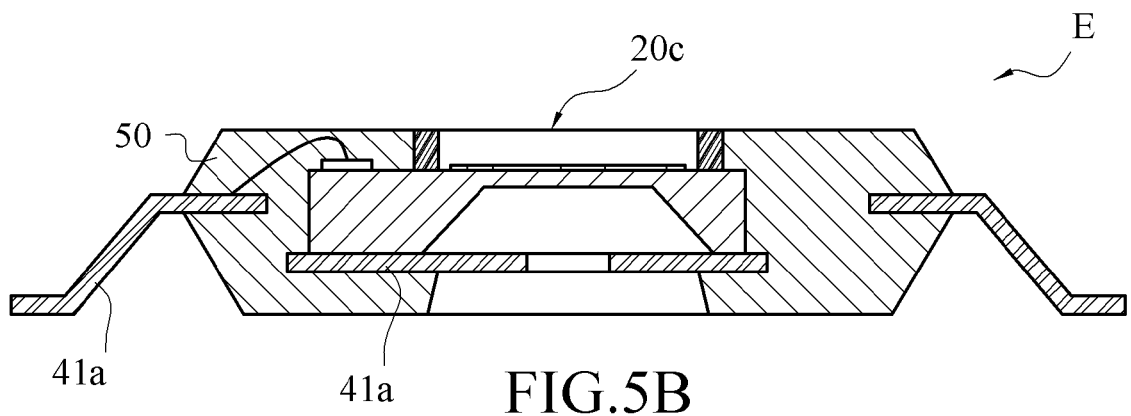
Figure 5C:
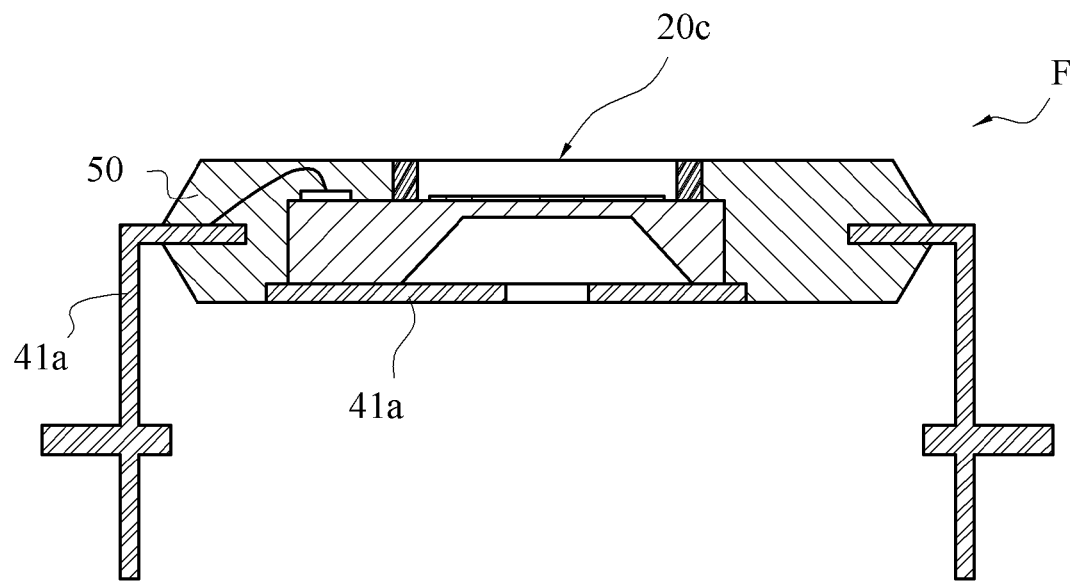

In FIG. 5A, the sensor module D is using the device structure 20c (or the device structure 20b) to bind and electric connect to a lead frame 41a and forming an encapsulation 50. The lead frame 41a can have different types, such as the sensor module E embodiment in FIG. 5B or the sensor module F embodiment in FIG. 5C.

In the foregoing sensor module embodiments D, E and F, the lead frame 41a can be one with the via hole 412 or an solid object without the via hole 412. When the lead frame 41a doesn't have the via hole 412, the device structure 20b can be used.

Figure 6:
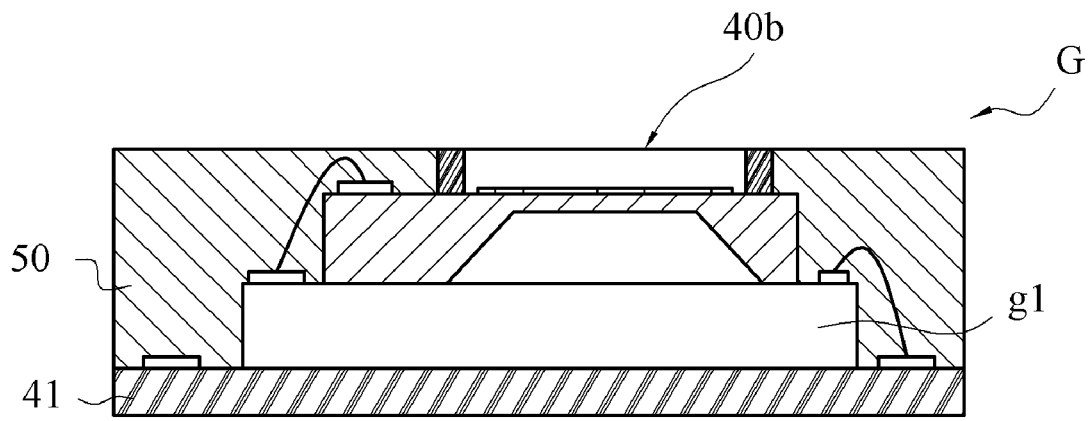
FIG. 6 is a diagram showing the cross view of the invention which applies to the three-dimensional subsystem sensor system.

In FIG. 6, the sensor module G embodiment is using the sensor chip package 40b (or the embodiment which has the supporting structure layer 2122) to bind and electric connect to an application specific integrated circuit (ASIC) device g1. The ASIC device g1 is also electric coupled to a carrier 41, and an encapsulation 50 is covering the carrier 41, the ASIC device g1, and the sensor chip package 40b (or the embodiment which has the supporting structure layer 2122).

Figure 7:
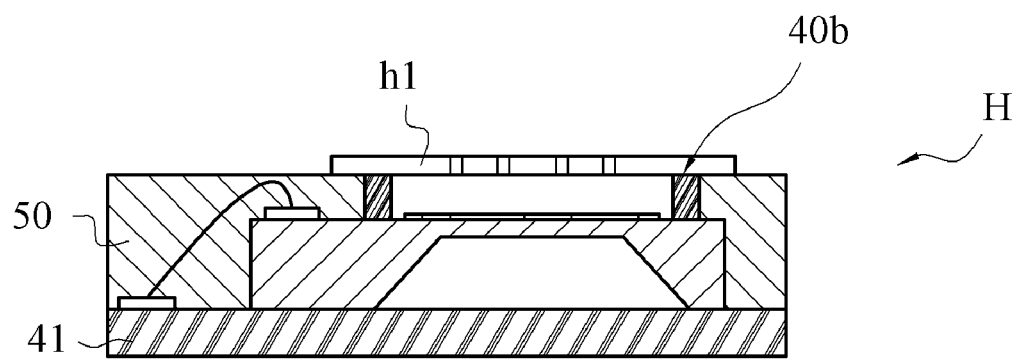
FIG. 7 is a diagram showing the cross view of the invention with added dust proof mechanism.

In FIG. 7, the sensor module H embodiment is using the sensor chip package 40b with the preformed ring 30 (or the embodiment which has the supporting structure layer 2122) where there is a dust-proof mechanism included on top of the ring 30, which can be a dust-proof filter such as a plastic weave, a paper weave, a fiber weave or a metal net to keep the good performance of the sensor chip package 40b (or the embodiment which has the supporting structure layer 2122).

Figure 8:
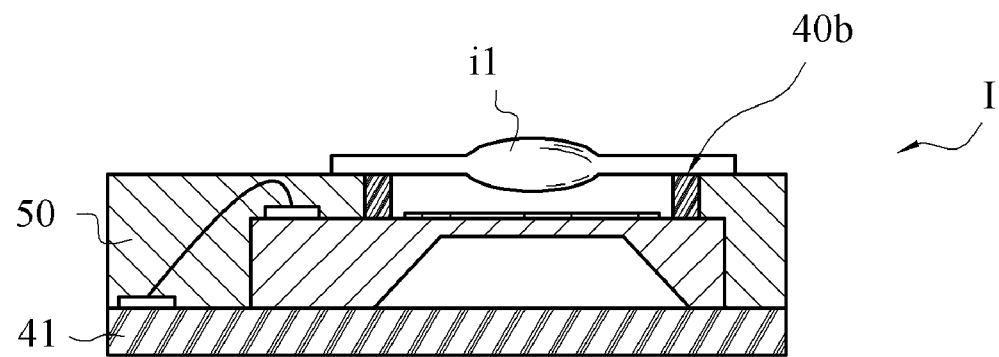
FIG. 8 is a diagram showing the cross view of the invention with added light filter/light condensing mechanism.

In FIG. 8, the sensor module I embodiment is using the sensor chip package 40b with the performed ring 30 (or the embodiment which has the supporting structure layer 2122) where there is a light filter or light condensing mechanism added to the top of the ring 30, which can be a light polarized plate, a light filter plate or a light condensing plate to corporate with the sensor chip package 40b (or the embodiment which has the supporting structure layer).

FIGS. 9A to 9D show a cross section view of the flowchart based on the invention. The steps include: provide a sensor wafer 201, which has a surface 202, and a plurality of sensor chips 21, the sensor chip 21 has an active surface 211 and a back 212, and the active surface 211 has sensitive area 2111 (step S10); form a dike layer 301 on the surface of the sensor wafer 201 (step S11); pattern the dike layer 301 to form a hollow interior area 32 which is surrounded by skirts 31, where together with the sensitive area 2111 of the sensor chip 21 and the periphery 21111 of the pad 2112 will define the ring 30 (step S12); dice the sensor wafer 201 to form a plurality of device structure 20 with preformed ring 30 (step S13).

Figure 9A:
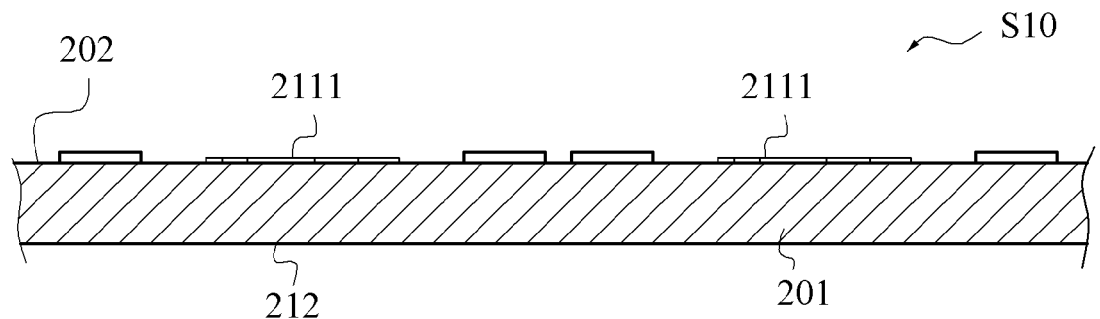
FIGS. 9A to 9D are the flowcharts showing the process of manufacturing the sensor chip package with preformed ring.
Figure 9B:
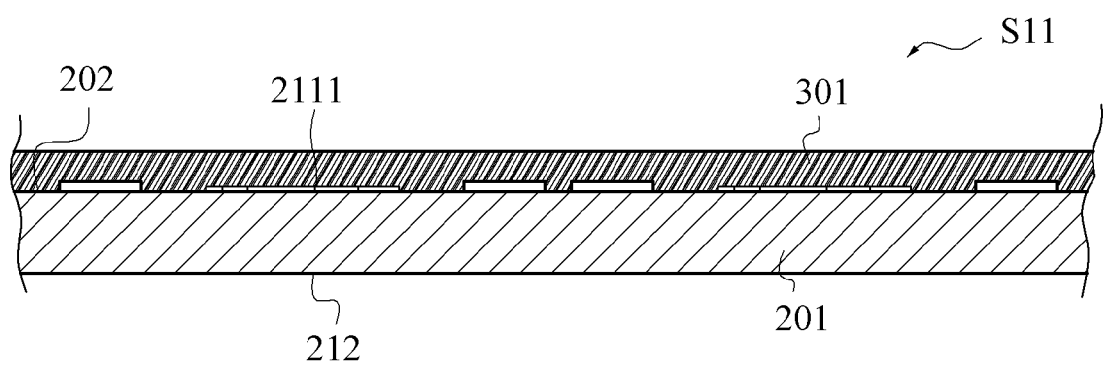
Figure 9C:
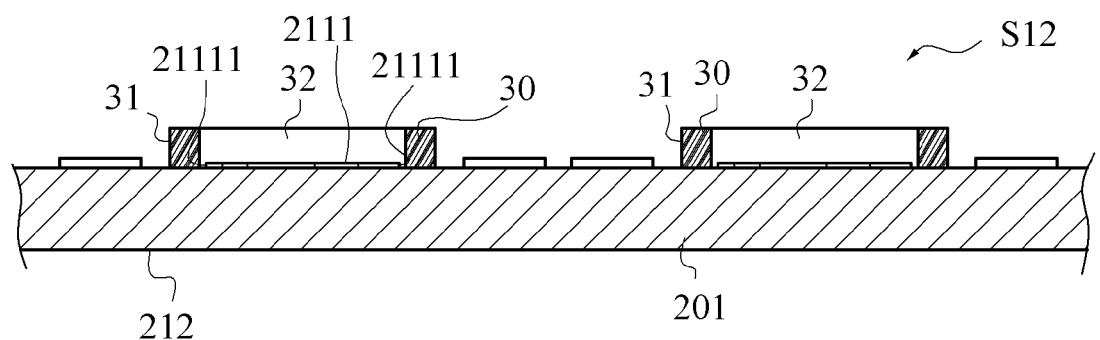
Figure 9D:
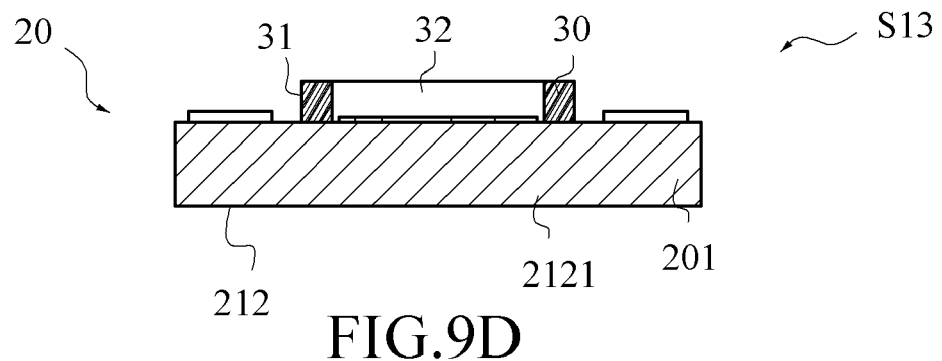
Figure 9E:
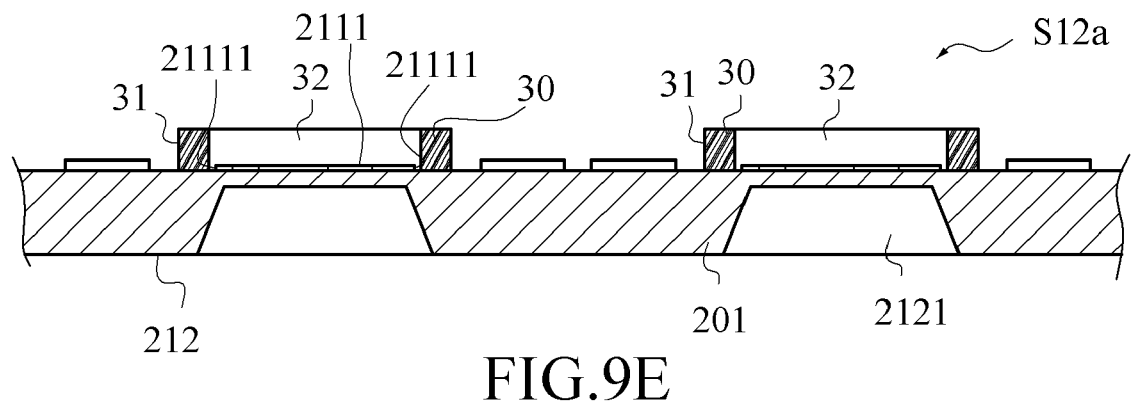
FIG. 9E shows the flowchart of the process of manufacturing the cave of the sensor chip package with preformed ring.
Figure 9F:
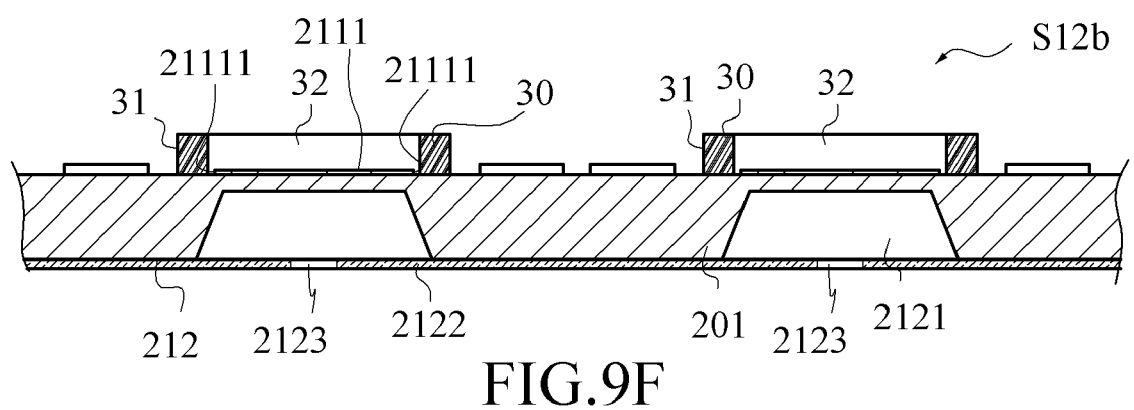
FIG. 9F shows the flowchart of the process of manufacturing the opening and the supporting structure layer of the sensor chip package with preformed ring.
Figure 10A:
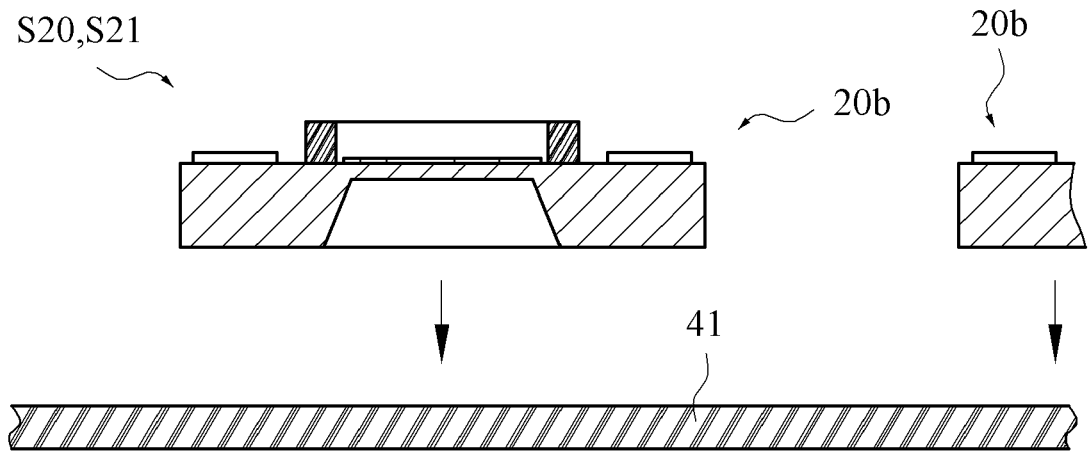
FIGS. 10A to 10E are the flowcharts showing the process of manufacturing the sensor module with preformed ring.
Figure 10B:
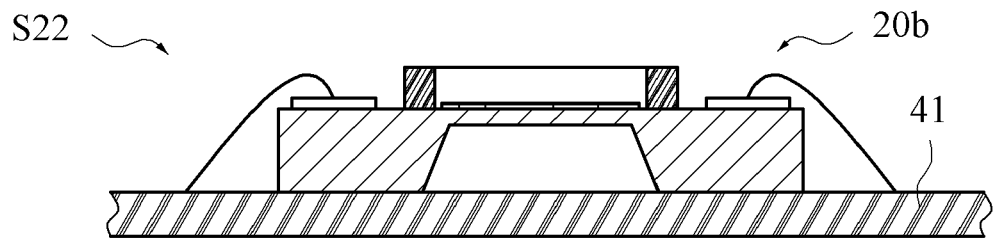
Figure 10C:
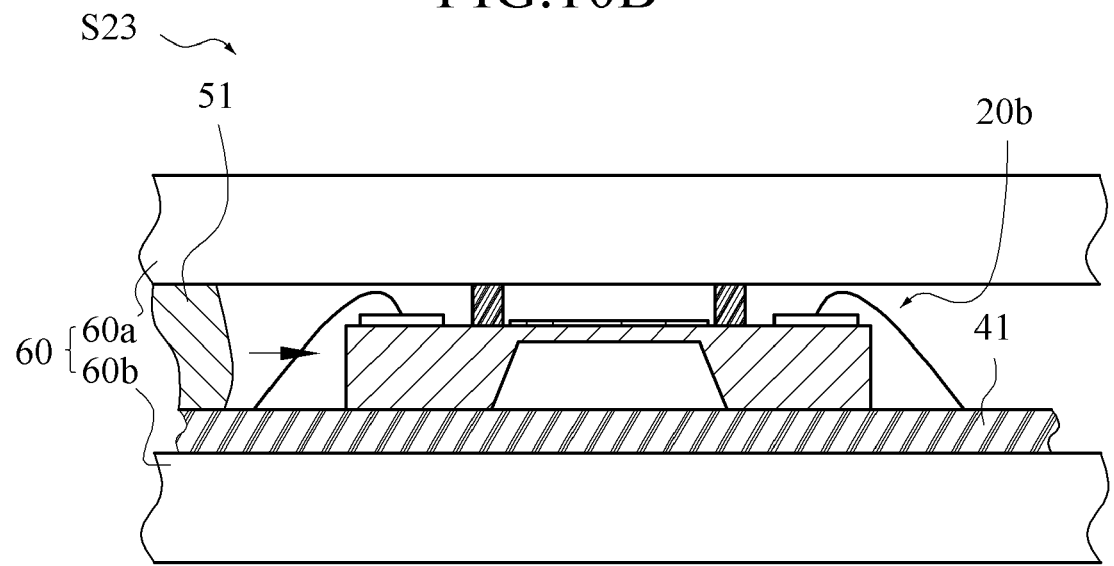
Figure 10D:
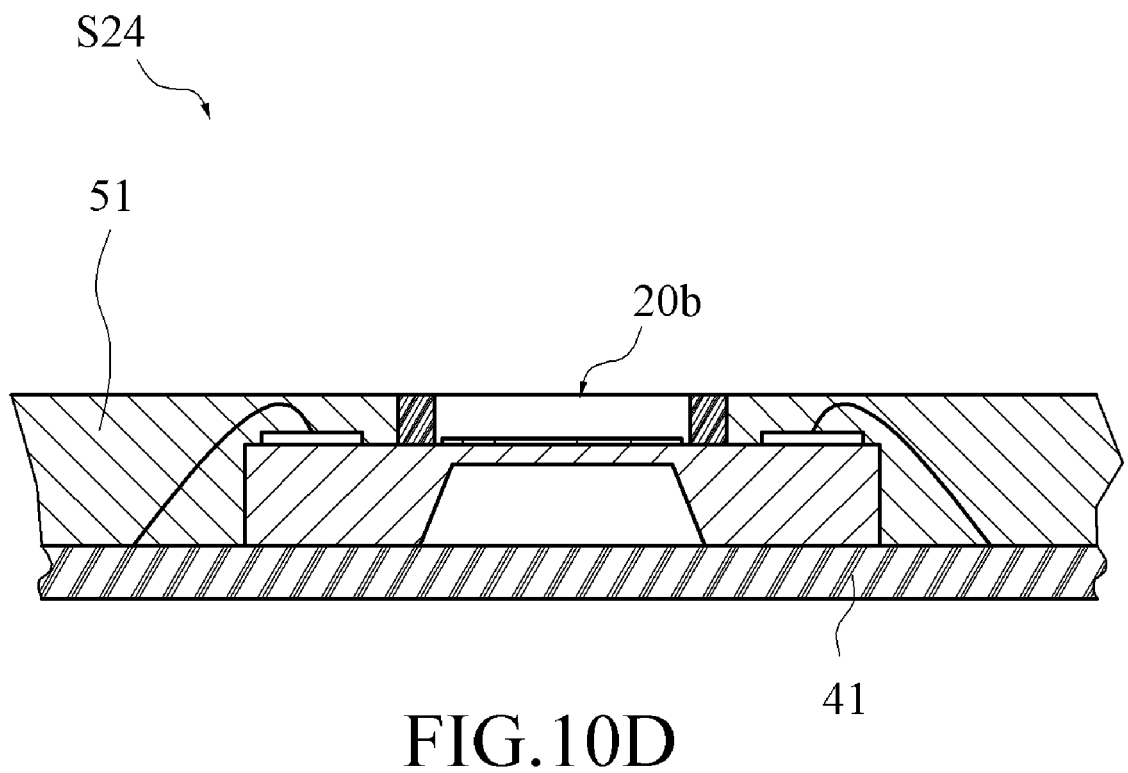
Figure 10E:
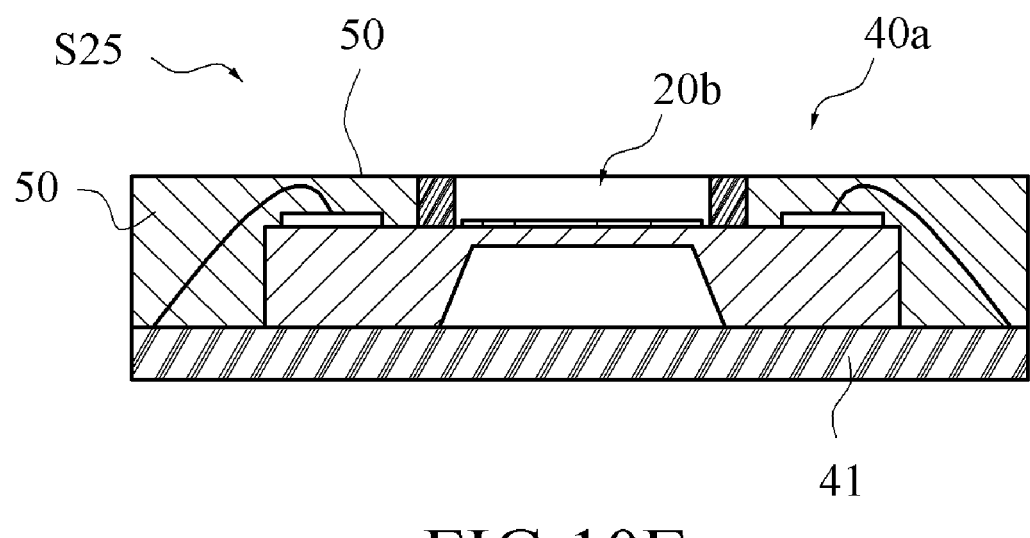

In FIG. 9E, a step of forming a cave 2121 on the back 212 of each sensor chip 21 (step S12a) is further included before the step of dicing (step S13) and after the step of forming the dike layer 301 (step S12). In addition, as shown in FIG. 9F, a step of forming a supporting structure layer 2122 which should be made of a strong material on the back of each sensor chip 21, and a via hole 2123 on the location which corresponds to the cave 2121 is further included.

FIGS. 10A to 10E show a cross section view of the flow chart based on the invention. The steps include: provide at least one device structure 20a with preformed ring (step S20); bind a device structure 20b on an upper surface of a carrier 41, where the upper surface of the carrier has a plurality of pads (step S21); electric connect the device structure 20b to the pad on the upper surface of the carrier 41 (step S22); place the device structure 20b and the carrier 41 in a packaging mold 60, where the upper mold 60a is tightly against the top of the ring 30 to make sure that the sealant 51 will only surround the skirts 31 of the ring 30 and will not flow into the interior area 32 of the ring, where if possible, the lower mold 60b can be against the lower surface of the carrier 41 (step S23), and certainly, if the carrier 41 is a lead frame 41a, the lower mold 60b of the packaging mold 60 need not to be against the lower surface; inject the sealant 51 into the packaging mold 60 to form an encapsulation 50, where the sealant 51 of the package 40 surrounds the periphery of the ring 30 to form an opening space within the interior area 32 (step S24); dice the encapsulation 50 to form a plurality of sensor chip packages 40a (step S25).

In addition, before the carrier 41 is provided, a via hole 412 can be in advance formed on the carrier 41 in order to be fit for the specific application of the sensor chip package 40a.

While the illustrative embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention

What is claimed is:

1. A sensor chip package, including:
    a carrier, which has an upper surface;
    a device structure, which binds and electrically couples the upper surface of the carrier, the device structure comprising:
        a sensor chip, which has an active surface and a back surface, wherein the active surface has a sensitive area and a plurality of pads, and wherein the back surface is bound to the upper surface of the carrier; and
        a ring, which is deposed on the active surface of the sensor chip, surrounding a periphery of the sensitive area, and which is used to define the sensitive area of the sensor chip; and
    an encapsulation, which covers the carrier, the sensor chip and the surface of an outer periphery of the ring, wherein an upper surface of the encapsulation is at the same level with a upper surface of the ring, and wherein the upper surface of the ring is exposed in the sensor chip package.

2. The sensor chip package of claim 1, wherein the carrier further includes a via hole.

3. The sensor chip package of claim 1, wherein the carrier is a printed circuit board or a lead frame.

4. The sensor chip package of claim 1, wherein the device structure further binds and electric couples to an application specific integrated circuit (ASIC) which binds and electric couples to the upper surface of the carrier.

5. The sensor chip package of claim 4, wherein the sensor chip further electric couples to the carrier.

6. The sensor chip package of claim 1, wherein the back surface further includes a cave.

7. The sensor chip package of claim 2, wherein the back surface further includes a supporting structure layer covering the back surface, and the supporting structure layer further includes a hole which corresponds to the cave of the back surface and the via hole of the carrier.

8. The device structure of claim 6, wherein the supporting structure layer includes rigidity materials such as glass, silicon wafer, metal or tempered glass.

* * * * *